United States Patent
Son et al.

(10) Patent No.: US 11,195,587 B2
(45) Date of Patent: Dec. 7, 2021

(54) SEMICONDUCTOR DEVICE

(71) Applicant: Samsung Electronics Co., Ltd., Suwon-si (KR)

(72) Inventors: Jae Ick Son, Hwaseong-si (KR); Dae Seok Byeon, Seongnam-si (KR); Bong Soon Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/886,053

(22) Filed: May 28, 2020

(65) Prior Publication Data
US 2021/0090663 A1   Mar. 25, 2021

(30) Foreign Application Priority Data
Sep. 24, 2019   (KR) .................. 10-2019-0117239

(51) Int. Cl.
  *G11C 16/26* (2006.01)
  *G11C 16/08* (2006.01)
  (Continued)

(52) U.S. Cl.
  CPC ............... *G11C 16/26* (2013.01); *G11C 7/18* (2013.01); *G11C 8/14* (2013.01); *G11C 16/08* (2013.01); *G11C 16/24* (2013.01); *H01L 24/05* (2013.01)

(58) Field of Classification Search
  None
  See application file for complete search history.

(56) References Cited

U.S. PATENT DOCUMENTS

| | | |
|---|---|---|
| 8,803,308 B2 | 8/2014 | Ishikawa |
| 9,170,296 B2 | 10/2015 | Malone et al. |
| 9,607,716 B2 | 3/2017 | Kilmer et al. |
| 9,768,129 B2 | 9/2017 | Lee et al. |

(Continued)

FOREIGN PATENT DOCUMENTS

| | | |
|---|---|---|
| JP | 2013131688 A | 7/2013 |
| JP | 2013219084 A | 10/2013 |

(Continued)

OTHER PUBLICATIONS

U.S. Office Action dated Jun. 9, 2021, issued in corresponding U.S. Appl. No. 16/995,093.

(Continued)

*Primary Examiner* — Tan T. Nguyen
(74) *Attorney, Agent, or Firm* — Harness, Dickey & Pierce, P.L.C.

(57) ABSTRACT

A semiconductor device includes a first semiconductor chip, a second semiconductor chip, an input/output circuit, a sensing line, and a detecting circuit. The first semiconductor chip includes bitlines, wordlines, first bonding pads electrically connected to the bitlines, second bonding pads electrically connected to the wordlines, and memory cells electrically connected to the bitlines and the wordlines. The second semiconductor chip includes third bonding pads that are electrically connected to the first bonding pads and fourth bonding pads that are electrically connected to the second bonding pads. The input/output circuit writes data to the memory cells via the third bonding pads. The sensing line extends along edge portions of at least one of the first and second semiconductor chips. The detecting circuit is in the second semiconductor chip and can detect defects from at least one of the first and second semiconductor chips using the sensing line.

20 Claims, 14 Drawing Sheets

(51) Int. Cl.
  *H01L 23/00* (2006.01)
  *G11C 7/18* (2006.01)
  *G11C 8/14* (2006.01)
  *G11C 16/24* (2006.01)

(56) References Cited

U.S. PATENT DOCUMENTS

| | | | |
|---|---|---|---|
| 10,727,215 B1* | 7/2020 | Zhang | H01L 25/50 |
| 2008/0054489 A1* | 3/2008 | Farrar | H01L 25/50 |
| | | | 257/777 |
| 2016/0197056 A1 | 7/2016 | Bhowmik et al. | |
| 2019/0164578 A1 | 5/2019 | Seo et al. | |
| 2020/0105721 A1 | 4/2020 | Park | |
| 2020/0227397 A1* | 7/2020 | Yada | H01L 27/11526 |
| 2020/0357811 A1* | 11/2020 | Kim | H01L 27/11582 |

FOREIGN PATENT DOCUMENTS

| | | |
|---|---|---|
| JP | 2015232500 A | 12/2015 |
| KR | 20160108930 A | 9/2016 |
| WO | WO-2019-099811 A1 | 5/2019 |

OTHER PUBLICATIONS

Office Action dated Aug. 24, 2021, issued in corresponding Indian Patent Application No. 202034029912.
U.S. Pat. No. US-2020/0294869-A1, dated Sep. 17, 2020, Jeong et al.†
Notice of Allowance received in related U.S. Appl. No. 16/995,093, dated Aug. 11, 2021.†

\* cited by examiner
† cited by third party

SEMICONDUCTOR DEVICE

This application claims priority to Korean Patent Application No. 10-2019-0117239, filed on Sep. 24, 2019 in the Korean Intellectual Property Office, and all the benefits accruing therefrom under 35 U.S.C. § 119, the disclosure of which is incorporated herein by reference in its entirety.

BACKGROUND

1. Technical Field

The present disclosure relates to a semiconductor device.

2. Description of Related Art

Stress generated in the process of fabricating a semiconductor device, particularly, during cutting and heating processes, may cause cracks in semiconductor chips.

Various methods have been suggested to detect such defects in semiconductor chips, and one of the methods is to arrange sensing lines in edge portions of each semiconductor chip and detect any defects with the use of the sensing lines.

However, as the structure of semiconductor devices becomes complicated and diversifies, the provision of such defect sensing elements in each semiconductor chip may complicate the fabrication of semiconductor devices and may increase the size of semiconductor devices. Thus, an efficient arrangement of defect sensing elements may be needed.

SUMMARY

Embodiments of the present disclosure provide a semiconductor device capable of simplifying the fabrication of semiconductor chips while maintaining a defect sensing function for any defects in the semiconductor chips.

Embodiments of the present disclosure also provide a semiconductor device capable of maintaining a defect sensing function for semiconductor chips with different thicknesses. However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an aspect of the present disclosure, a semiconductor device includes a first semiconductor chip, a second semiconductor chip, a sensing line, and a detecting circuit. The first semiconductor chip includes bitlines, wordlines, first bonding pads, second bonding pads, and memory cells. The memory cells are electrically connected to the bitlines and the wordlines. The first bonding pads are electrically connected to the bitlines. The second bonding pads are electrically connected to the wordlines. The second semiconductor chip includes third bonding pads, fourth bonding pads, and an input/output circuit. The third bonding pads are electrically connected to the first bonding pads. The fourth bonding pads are electrically connected to the second bonding pads. The input/output circuit is configured to write data to the memory cells via the third bonding pads and the fourth bonding pads. The sensing line extends along an edge portion of the first semiconductor chip, an edge portion of the second semiconductor chip, or the edge portion of the first semiconductor chip and the edge portion of the second semiconductor chip. The detecting circuit is in the second semiconductor chip. The detecting circuit is configured to detect defects from the first semiconductor chip, the second semiconductor chip, or both the first semiconductor chip and the second semiconductor chip using the sensing line.

According to another aspect of the present disclosure, a semiconductor device includes a first semiconductor chip including a first sensing line along edge portions of the first semiconductor chip to surround the first semiconductor chip; a second semiconductor chip including a second sensing line along edge portions of the second semiconductor chip to surround the second semiconductor chip; and a detecting circuit configured to detect defects from the first semiconductor chip using the first sensing line and configured to detect defects from the second semiconductor chip using the second sensing line. The detecting circuit is in the second semiconductor chip, but the detecting circuit is not in the first semiconductor chip.

According to another aspect of the present disclosure, a semiconductor device includes a first semiconductor chip; a second semiconductor chip that is below the first semiconductor chip; a sensing line extending along an edge portion the first semiconductor chip, an edge portion of the second semiconductor chip, or both the edge portion of the first semiconductor chip and the edge portion of the second semiconductor chip; and a detecting circuit electrically connected to the sensing line and in the second semiconductor chip. The detecting circuit is configured to detect defects from the first semiconductor chip, the second semiconductor chip, or both the first semiconductor chip and the second semiconductor chip using the sensing line. A first height from a bottom surface of a first substrate of the first semiconductor chip to a top surface of the first semiconductor chip differs from a second height from a bottom surface of a second substrate of the second semiconductor chip to a top surface of the second semiconductor chip.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Embodiments of the present disclosure will hereinafter be described with reference to the accompanying drawings.

Figure 1:
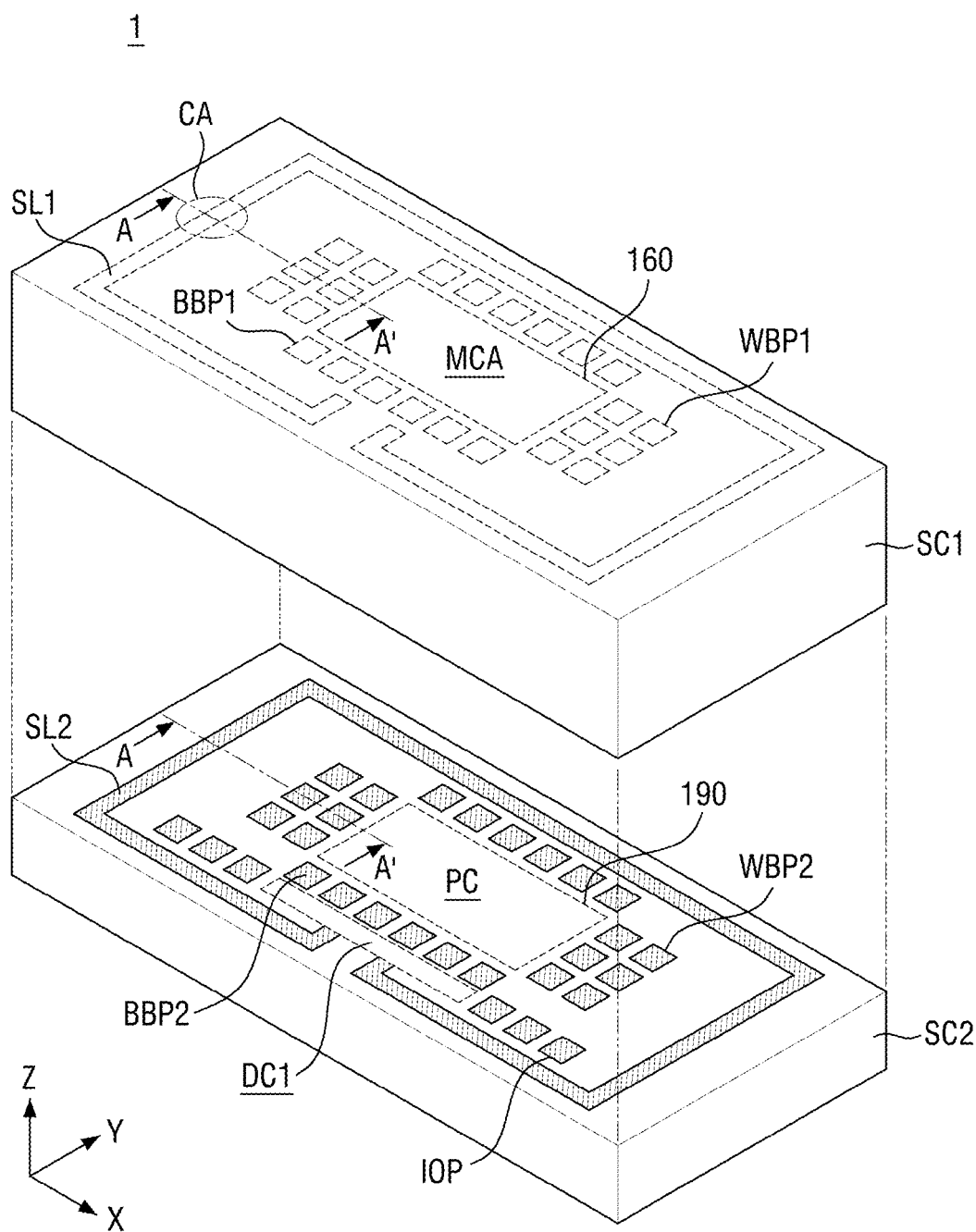
FIG. 1 is an exploded perspective view of a semiconductor device according to some embodiments of the present disclosure.
Figure 2:
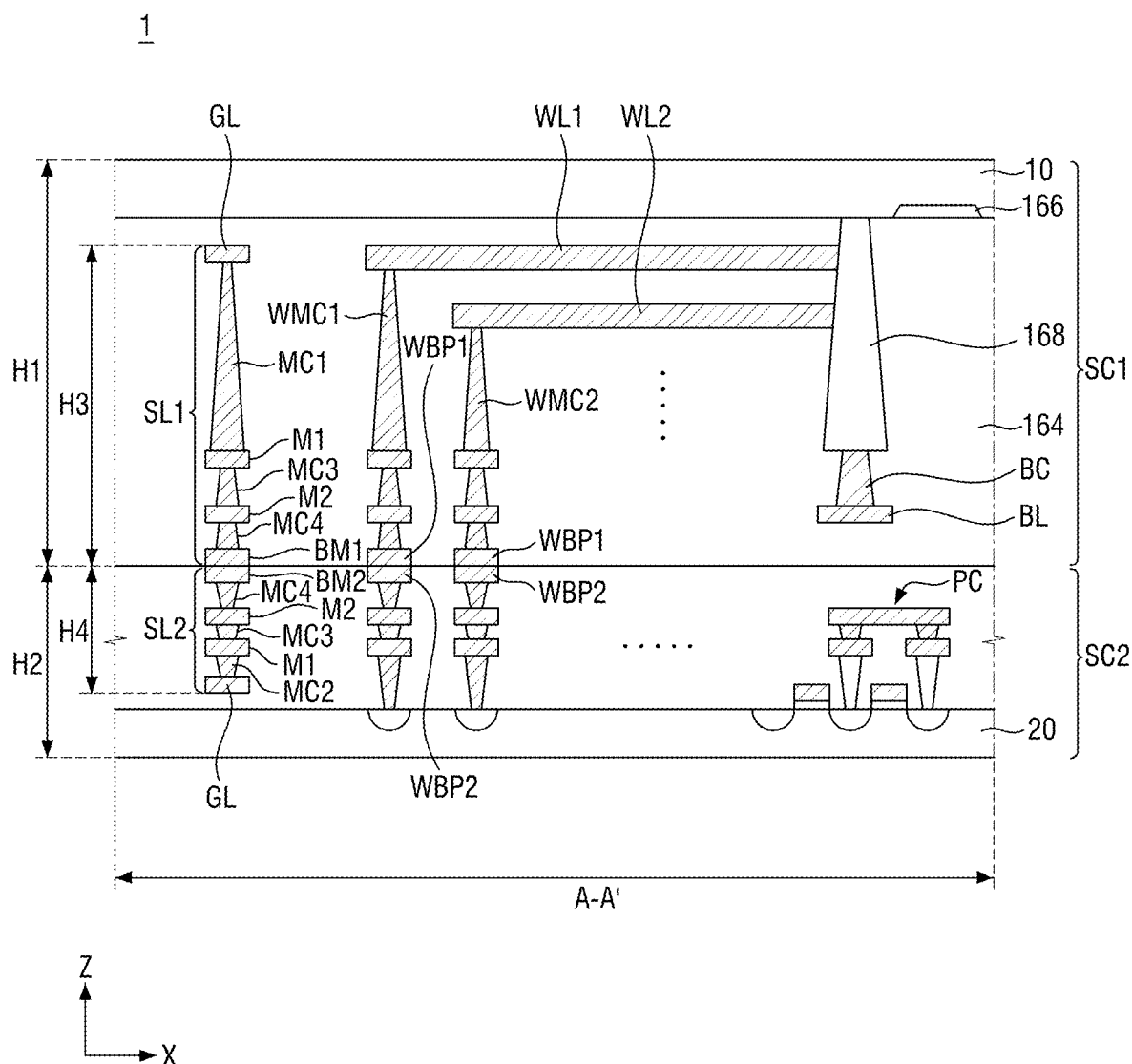
FIG. 2 is a cross-sectional view taken along line A-A' of FIG. 1.
Figure 3:
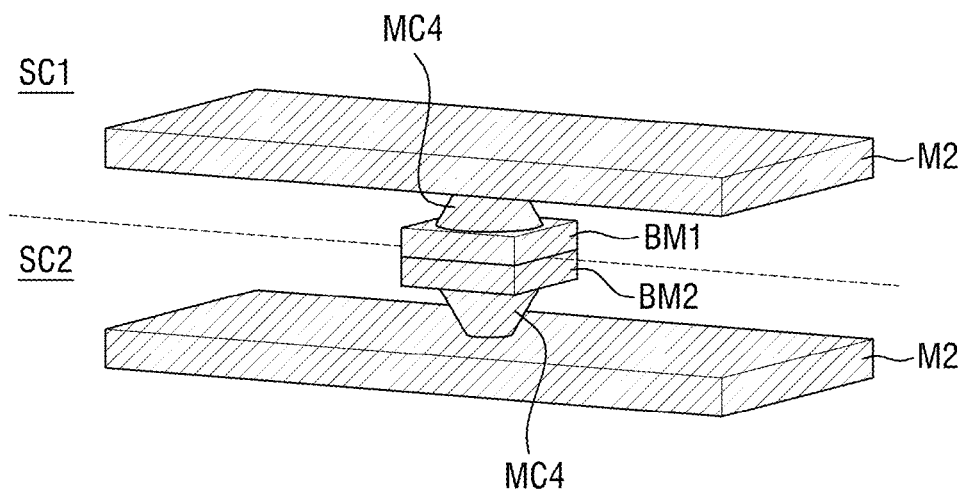
FIG. 3 is a partial perspective view of a contact area of FIG. 1.
Figure 4:
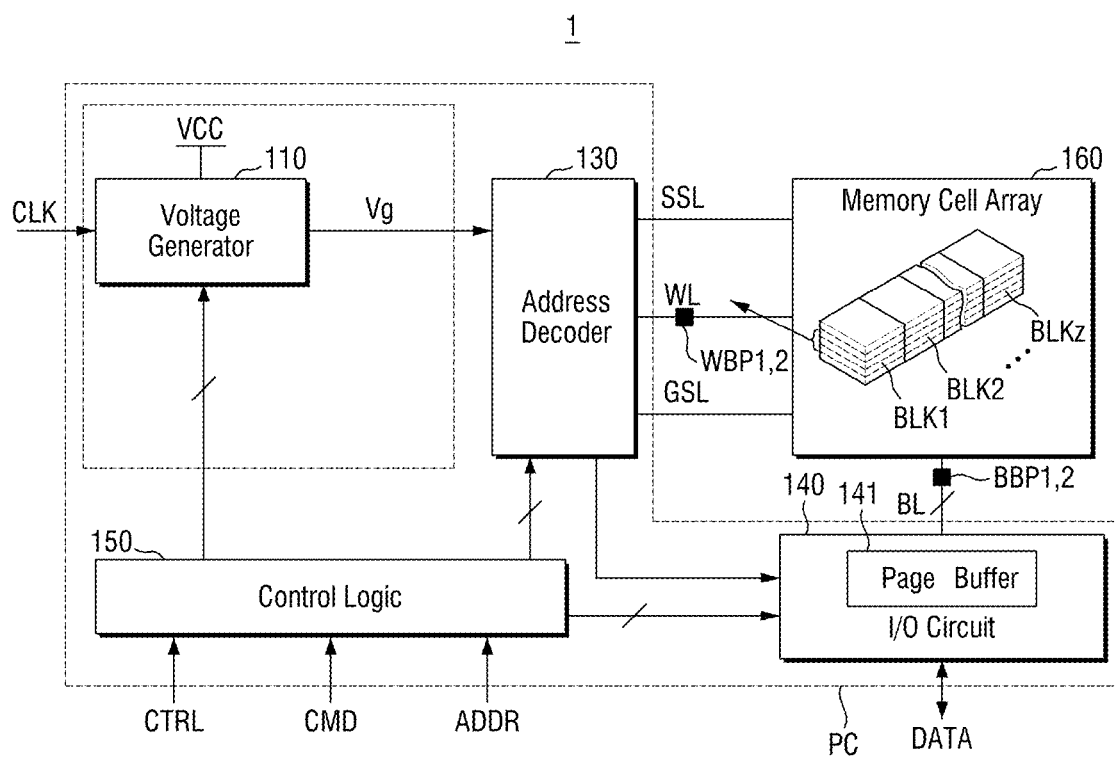
FIG. 4 is a block diagram illustrating a memory cell array and a peripheral circuit of FIG. 1.
Figure 5:
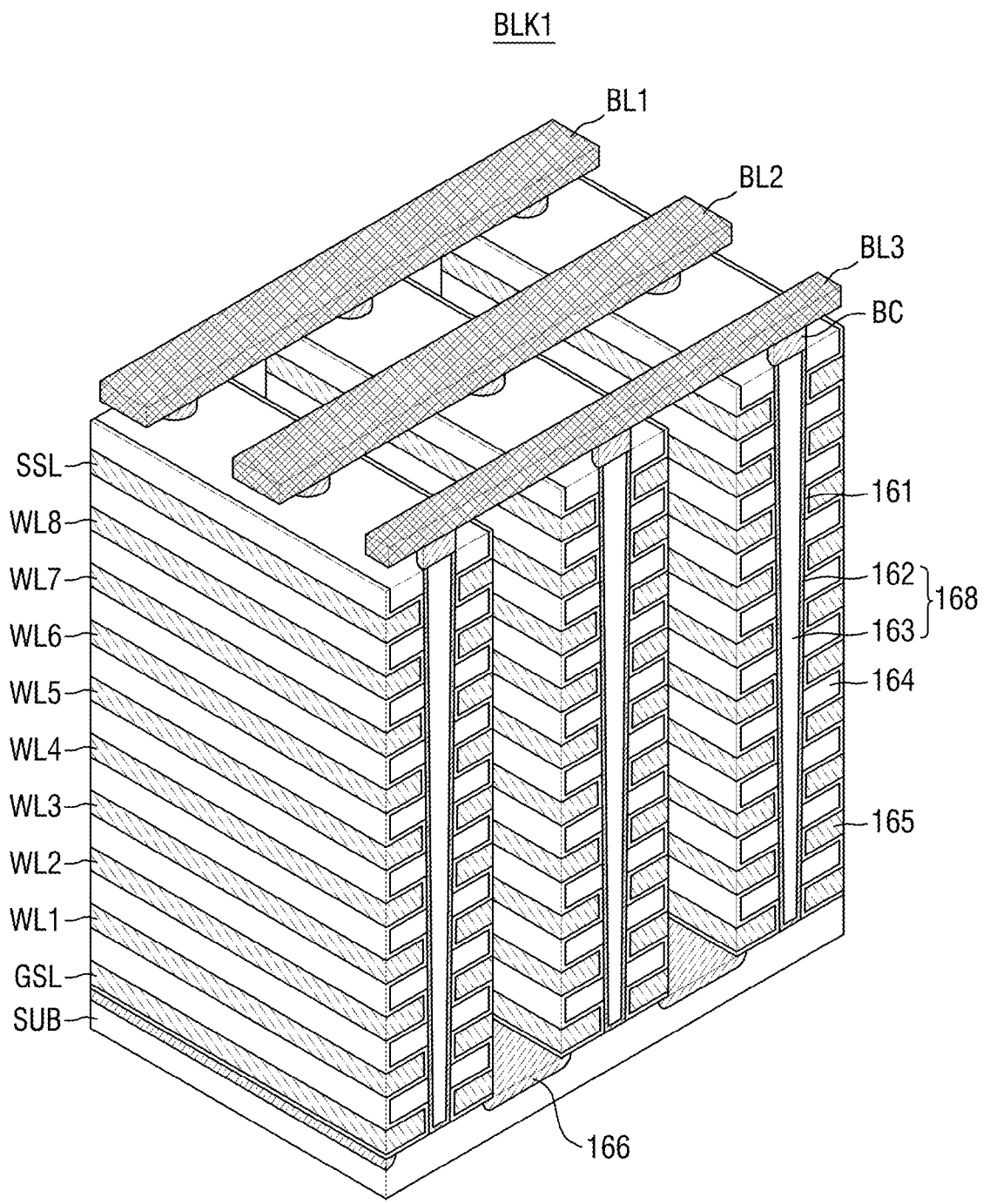
FIG. 5 is a perspective view of the memory cell array of FIG. 4.
Figure 6:
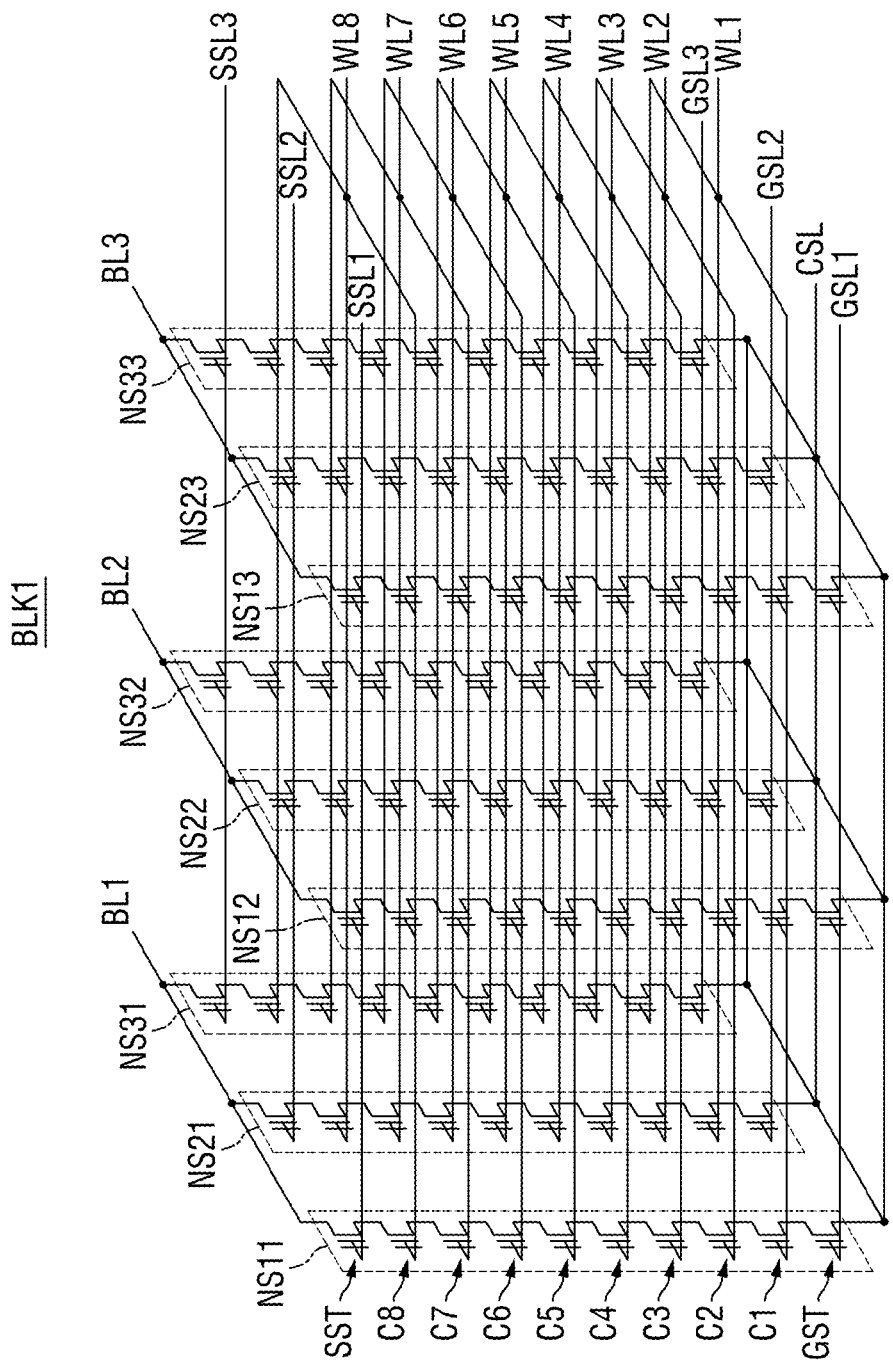
FIG. 6 is a circuit diagram of the memory cell array of FIG. 4.

FIG. 1 is an exploded perspective view of a semiconductor device according to some embodiments of the present disclosure. FIG. 2 is a cross-sectional view taken along line A-A' of FIG. 1. FIG. 3 is a partial perspective view of a contact area of FIG. 1. FIG. 4 is a block diagram illustrating a memory cell array and a peripheral circuit of FIG. 1. FIG. 5 is a perspective view of the memory cell array of FIG. 4. FIG. 6 is a circuit diagram of the memory cell array of FIG. 4.

Referring to FIG. 1, a semiconductor device 1 includes first and second semiconductor chips SC1 and SC2.

The first semiconductor chip SC1 may be disposed on the second semiconductor chip SC2 (in, for example, a Z-axis direction). For convenience, the first and second semiconductor chips SC1 and SC2 are illustrated as being separate, but the first semiconductor chip SC1 may actually be disposed to be in contact with the top surface of the second semiconductor chip SC2. In other words, the bottom surface of the first semiconductor chip SC1 and the top surface of the second semiconductor chip SC2 may be in contact with each other.

The semiconductor device 1 will hereinafter be described as being, for example, a nonvolatile memory device, but the present disclosure is not limited thereto.

A memory cell array MCA may be disposed in the first semiconductor chip SC1, and a peripheral circuit PC for an operation of the memory cell array MCA may be disposed in the second semiconductor chip SC2. The memory cell array MCA, which includes a plurality of memory cells, may be disposed in the first semiconductor chip SC1, and the peripheral circuit PC, which includes a plurality of functional elements (e.g., circuitry) that control an operation of the memory cell array MCA in the first semiconductor chip SC1, may be disposed in the second semiconductor chip SC2.

The memory cell array MCA and the peripheral circuit PC will hereinafter be described with reference to FIGS. 4 to 6, but the present disclosure is not limited to the following descriptions of the memory cell array MCA and the peripheral circuit PC.

Referring to FIG. 4, in some embodiments, the semiconductor device 1 may include a voltage generator 110, an address decoder 130, an input/output (I/O) circuit 140, a control logic 150, and a memory cell array 160.

The voltage generator 110, the address decoder 130, the I/O circuit 140, and the control logic 150, which are the elements of the peripheral circuit PC of FIG. 1, and may be disposed in the second semiconductor chip SC2, and the memory cell array 160 may be disposed in the first semiconductor chip SC1.

Figure 7:
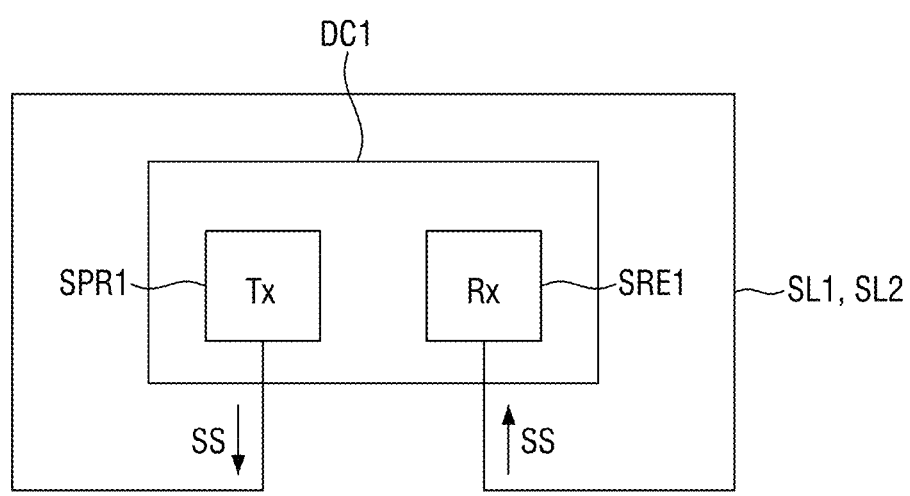
FIG. 7 is an example block diagram of a detecting circuit of FIG. 1.

In some embodiments, the voltage generator 110, address decoder 130, I/O circuit 140, control logic 150, signal provider SPR1 (e.g. transceiver Tx) and signal receiver SRE1 (e.g. receiver Rx) in FIG. 7, detecting circuits DC1 to DC4 in FIGS. 7 to 10, 13, 14, and 15 may be implemented with processing circuitry processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The semiconductor device 1 may include, for example, a NAND flash memory, a vertical NAND (VNAND) flash memory, a NOR Flash memory, a resistive random access memory (RRAM), a phase-change random access memory (PRAM), a magneto resistive random access memory (MRAM), a ferroelectric random access memory (FRAM), a spin transfer torque-random access memory (STT-RAM), or the like, but the present disclosure is not limited thereto.

The semiconductor device 1 will hereinafter be described as being, for example, a VNAND flash memory, but the present disclosure is not limited thereto. That is, the present disclosure may also be applicable to various nonvolatile memories other than a VNAND flash memory.

The voltage generator 110 may generate an operating voltage Vg used for one or more operations of the semiconductor device 1 by using a power supply voltage Vcc and a clock signal CLK. Examples of the operating voltage Vg may include a program voltage, a pass voltage, a read voltage, a read pass voltage, a verify voltage, an erase voltage, a common source line voltage, a well voltage, and the like, but the present disclosure is not limited thereto.

The voltage generator 110 may generate a wordline voltage used for programming new data into the memory cells, reading data from the memory cells, or erasing data from the memory cells of the memory cell array 160.

In some embodiments, the wordline voltage generated by the voltage generator 110 for programming new data into the memory cells of the memory cell array 160 may be cascaded, for example, to improve program operating speed.

The address decoder 130 may select one of a plurality of memory blocks BLK1 to BLKz in response to an address ADDR. Also, the address decoder 130 may be connected to the memory cell array 160 via a plurality of wordlines WL, at least one string select line SSL, and at least one ground select line GSL.

The address decoder 130 may select one of the wordlines WL, the string select line SSL, and the ground select line GSL using a decoded row address. Also, the address decoder 130 may decode a column address from among input addresses. The decoded column address may be transmitted to the I/O circuit 140. In some embodiments, the address decoder 130 may include a row decoder, a column decoder, an address buffer, and the like.

The I/O circuit 140 may be connected to the memory cell array 160 via bitlines BL. The I/O circuit 140 may be configured to receive the decoded column address from the address decoder 130. The I/O circuit 140 may select one of the bitlines BL using the decoded column address.

The I/O circuit 140 may include a plurality of page buffers 141, which store data to be programmed by the semiconductor device 1 or store data read out by the semiconductor device 1. Each of the page buffers 141 may include a plurality of latches.

During a program operation, data stored in the plurality of page buffers 141 may be programmed onto a page corresponding to a memory block (or a set of memory cells) selected via one of the bitlines BL. During a read operation, data read out from a page corresponding to a selected memory block may be stored in the page buffer 141 via one of the bitlines BL.

In some embodiments, information regarding memory cells corresponding to a bitline BL to which a forcing voltage is applied in a previous program loop may be temporarily stored in the plurality of page buffers 141.

During a program operation, the I/O circuit 140 may operate as a write driver to apply a program bitline voltage (such as a program inhibit voltage, a program forcing voltage, or a program voltage) to bitlines BL connected to memory cells when the address decoder 130 applies a program wordline voltage to a selected wordline WL. However, the present disclosure is not limited to this.

The I/O circuit 140 may read out data from a first region of the memory cell array 160 and may store the read-out data in a second region of the memory cell array 160. For example, the I/O circuit 140 may be configured to perform a copy-back operation.

The control logic 150 may control general operations of the semiconductor device 1 (such as program, read, erase, and the like). For example, while the semiconductor device 1 is operating, the control logic 150 may control operations of the voltage generator 110, the address decoder 130, and the I/O circuit 140. The control logic 150 may operate in response to control signals CTRL, commands CMD, or instructions input thereto from an external source (e.g., host, not shown) a host (not shown) and may be configured to access the memory cell array 160 and control operations of the semiconductor device 1 discussed herein, thereby transforming the control logic 150 into a special purpose controller. The control logic 150 is illustrated as controlling the operations of only the voltage generator 110, the address decoder 130, and the I/O circuit 140, but the present disclosure is not limited thereto. The semiconductor device 1 may include more elements than those illustrated, and the control logic 150 may control general operations of the elements of the semiconductor device 1.

The memory cell array 160, which is disposed in the first semiconductor chip SC1 of FIG. 1, may be configured to have the structure of, for example, a three-dimensional (3D) memory array. The 3D memory array has vertical orientation and may include a plurality of vertical NAND strings in which at least one memory cell is located over another memory cell. The at least one memory cell may include, for example, a charge trap layer. Each of the vertical NAND strings may include at least one select transistor disposed above memory cells. The at least one select transistor may have the same structure as the memory cells and may be formed monolithically together with the memory cells. The term "monolithic" means that layers of each level of the 3D memory array are directly deposited on the layers of each underlying level of the 3D memory array.

The 3D memory array may include (or consist of) a plurality of levels, and wordlines or bitlines that are shared may be disposed between the levels. The semiconductor device 1 may be a flash memory device having a conductive floating gate as a charge storage layer or a charge trap flash (CTF) memory device having an insulating film as a charge storage layer. The semiconductor device 1 will hereinafter be described as being, for example, a VNAND flash memory device.

The memory cell array 160 may include the memory blocks BLK1 to BLKz. The memory blocks BLK1 to BLKz may be connected to the address decoder 130 via the wordlines WL, the at least one string select line SSL, and the at least one ground select line GSL and may be connected to the I/O circuit 140 via the bitlines BL. In some embodiments, the wordlines WL may have a stacked plate structure.

Each of the memory blocks BLK1 to BLKz may include a plurality of 3D strings, which are arranged on a substrate in first and second directions that are different from each other and in a third direction that is perpendicular to the plane defined by the first and second directions. Each of the 3D strings may include at least one string select transistor, a plurality of memory cells, and at least one ground select transistor, which are connected in series between a bitline and a common source line CSL. Here, each of the memory cells may store at least one bit. In some embodiments, at least one dummy cell may be provided between the at least one string select transistor and the memory cells. In some embodiments, at least one dummy cell may be provided between the memory cells and the at least one ground select transistor. The memory blocks BLK1 to BLKz will hereinafter be described in detail with reference to FIGS. 5 and 6.

Referring to FIG. 5, the memory block BLK1 may be formed in a vertical direction with respect to a substrate SUB. For example, an n+ doped region 166 including impurities may be formed on the substrate SUB. The n+ doped region 166 may be used as, for example, a common source line CSL of FIG. 6.

Gate electrodes 165 and insulating films 164 may be alternately stacked on the substrate SUB. Data storage films 161 may be formed between the gate electrodes 165 and the insulating films 164.

Pillars 168 may vertically penetrate the gate electrodes 165 and the insulating films 164. The pillars 168 may be formed in a V shape. The pillars 168 may be connected to the substrate SUB through the gate electrodes 165 and the insulating films 164. Filling dielectric patterns 163 may form inside of the pillars 168 using an insulating material such as silicon oxide. Vertical active patterns 162 may be formed on the outside of the pillars 168 using a channel semiconductor.

The gate electrodes 165 of the memory block BLK1 may be connected to the ground select line GSL, wordlines WL1 to WL8, and the string select line SSL. The vertical active patterns 162, which are formed on the outside of the pillars 168 of the memory block BLK1 and are used as channels, may be connected to a plurality of bitlines BL1 to BL3 via bit contacts BC. FIG. 5 illustrates that the memory block BLK1 includes eight wordlines WL and three bitlines BL, but the present disclosure is not limited thereto. That is, the numbers of wordlines WL and bitlines BL provided in the memory block BLK1 may vary.

Referring to FIG. 6, cell strings NS11 to NS33 may be disposed between the bitlines BL1 to BL3 and the common source line CSL. Each of the strings NS11 to NS33, for example, the cell string NS11, may include a ground select transistor GST, a plurality of memory cells C1 to C8, and a string select transistor SST.

The string select transistor SST may be connected to the string select line SSL. The string select line SSL may be divided into first to third string select lines SSL1 to SSL3. The ground select transistor GST may be connected to first to third ground select lines GSL1 to GSL3. In some embodiments, the first to third ground select lines GSL1 to GSL3 may be connected to one another. The string select transistor SST may be connected to the bitlines BL, and the ground selection transistor GST may be connected to the common source line CSL.

The memory cells C1 to C8 may be connected to the corresponding wordlines WL1 to WL8, respectively. A group of memory cells that are connected to the same wordline and can be programmed at the same time may be referred to as a page. The memory block BLK1 may include a plurality of pages, illustrated. A plurality of pages may be connected to a single wordline WL. Referring to FIG. 6, each of the wordlines WL1 to WL8, for example, the wordline WL4, may be connected in common to three pages.

Pages may be the unit of programming/reading data, and memory block BLK1 may be the unit of erasing data. That is, when a nonvolatile memory device performs a program or read operation, data may be programmed or read in units of pages, and when a nonvolatile memory device performs an erase operation, data may be erased in units of memory blocks. That is, data stored in the memory cells included in a single memory block, for example, data stored in the memory cells C1 to C8, can be erased all at once.

Each of the memory cells C1 to C8 may store data of one bit or two or more bits. Memory cells capable of storing data of one bit in the one of the memory cells C1 to C8 may be referred to as a single-level cells (SLCs) or single-bit cells. Memory cells capable of storing data of two or more bits may be referred to as a multi-level cells (MLCs) or multi-bit cells. A 2-bit MLC can store two page data in a single physical page. Thus, six page data can be stored in the memory cell C4, which is connected to the wordline WL4. In some embodiments, the memory cells C1 to C8 may be able to store data of three or more bits, in which case, three or more page data can be stored in a single physical page.

Referring again to FIGS. 1 and 2, first wordline bonding pads WBP1 may be disposed on, for example, the left and right sides of the memory cell array MCA, which is disposed in the first semiconductor chip SC1, and first bitline bonding pads BBP1 may be disposed on, for example, the upper and lower sides of the memory cell array MCA.

Specifically, the first wordline bonding pads WBP1 may be disposed on a surface of the first semiconductor chip SC1 in a horizontal direction (for example, an X-axis direction), and the first bitline bonding pads BBP1 may be disposed on the surface of the memory cell array MCA in a vertical direction (for example, a Y-axis direction). However, the present disclosure is not limited to this. That is, the arrangement of the first wordline bonding pads WBP1 and the first bitline bonding pads BBP1 may vary.

FIG. 1 illustrates that there are provided a single memory cell array MCA and first wordline bonding pads WBP1 and first bitline bonding pads BBP1 connected to the single memory cell array MCA, but the present disclosure is not limited thereto. That is, alternatively, more than one memory cell array MCA may be provided, and the numbers of first wordline bonding pads WBP1 and first bitline bonding pads BBP1 may increase accordingly.

The first wordline bonding pads WBP1 and the first bitline bonding pads BBP1 may be disposed on a surface of the first semiconductor chip SC1 that faces the second semiconductor chip SC2, for example, on the bottom surface of the first semiconductor chip SC1.

The first wordline bonding pads WBP1 may be electrically connected to wordlines WL1 and WL2 of the memory cell array MCA described above. For example, FIG. 2 illustrates that the first wordline bonding pads WBP1 are electrically connected to the wordlines WL1 and WL2 via metal contacts WMC1, WMC2, MC3, and MC4 and wires M1 and M2, but the present disclosure is not limited thereto.

The first bitline bonding pads BBP1 may be electrically connected to a bitline BL of the memory cell array MCA. The first bitline bonding pads BBP1 may be electrically connected to the bitline BL via metal contacts and wires.

Second wordline bonding pads WBP2 and second bitline bonding pads BBP2 may be disposed on a surface of the second semiconductor chip SC2. Specifically, the second wordline bonding pads WBP2 and the second bitline bonding pads BBP2 may be disposed on a surface of the second semiconductor chip SC2 that faces the first semiconductor chip SC1, for example, on the top surface of the second semiconductor chip SC2.

The second wordline bonding pads WBP2 and the second bitline bonding pads BBP2 may be disposed to correspond to the first wordline bonding pads WBP1 and the first bitline bonding pads BBP1, respectively. That is, the second wordline bonding pads WBP2 may be disposed to correspond to the first wordline bonding pads WBP1 and the second bitline bonding pads BBP2 may be disposed to correspond to the first bitline bonding pads BBP1.

Accordingly, when the bottom surface of the first semiconductor chip SC1 and the top surface of the second semiconductor chip SC2 are in contact with each other, the first wordline bonding pads WBP1 may be in direct contact with, and electrically connected to, the second wordline bonding pads WBP2, and the first bitline bonding pads BBP1 may be in direct contact with, and electrically connected to, the second bitline bonding pads BBP2.

The first wordline bonding pads WBP1 may be in direct contact with the second wordline bonding pads WBP2 and may thus electrically connect the wordlines WL of the memory cell array 160 of FIG. 4 and the peripheral circuit PC. Also, the first bitline bonding pads BBP1 may be in direct contact with the second bitline bonding pads BBP2 and may thus electrically connect the bitlines BL of the memory cell array 160 and the peripheral circuit PC.

FIG. 2 illustrates that the second wordline bonding pads WBP2 are electrically connected to the peripheral circuit PC via metal contacts MC2, MC3, and MC4 and wires M1 and M2, but the present disclosure is not limited thereto. The second bitline bonding pads BBP2 may be electrically connected to the peripheral circuit PC via metal contacts and wires.

Wires (M1 and M2) may include, for example, a metal such as copper (Cu) or aluminum (Al), but the present disclosure is not limited thereto. For convenience, FIG. 2 illustrates only two types of wires, i.e., the wires (M1 and M2), but the number of wires provided may vary.

Metal contacts (MC1, MC2, MC3, MC4, WMC1, and WMC2) may include, for example, tungsten (W) and Cu, but the present disclosure is not limited thereto. For convenience, FIG. 2 illustrates only six types of metal contacts, i.e., the metal contacts (MC1, MC2, MC3, MC4, WMC1, and WMC2), but the number of metal contacts provided may vary.

The substrate 10 and a substrate 20 may include, for example, silicon substrates, germanium substrates, or silicon-germanium substrates. Alternatively, the substrates 10 and 20 may include, for example, silicon-on-insulator (SOI) substrates or germanium-on-insulator (GOI) substrates. In some embodiments, the substrates 10 and 20 may be, for example, p-type semiconductor substrates, but the present disclosure is not limited thereto.

Referring to FIGS. 1 and 2, the memory cell array MCA is disposed in the first semiconductor chip SC1, and the peripheral circuit PC for an operation of the memory cell array MCA is disposed in the second semiconductor chip SC2. That is, the peripheral circuit PC for an operation of the memory cell array MCA is not disposed in the first semiconductor chip SC1, and the memory cell array MCA is not disposed in the second semiconductor chip SC2.

Since the memory cell array MCA is disposed in the first semiconductor chip SC1 and the peripheral circuit PC for an operation of the memory cell array MCA is disposed in the second semiconductor chip SC2, the first and second semiconductor chips SC1 and SC2 may have different thicknesses.

Specifically, a first height H1 measured from the bottom surface of the substrate 10 of the first semiconductor chip SC1 to the top surface of the first semiconductor chip SC1 may differ from a second height H2 measured from the bottom surface of the substrate 20 of the second semiconductor chip SC2 to the top surface of the second semiconductor chip SC2.

For example, the first height H1 may be greater than the second height H2.

In some embodiments, the ratio of the first and second heights H1 and H2 may be 2:1 or greater. Accordingly, the integration density of the semiconductor device 1 may be raised by providing as many memory cells as possible in the memory cell array MCA. Also, in some embodiments, the ratio of the first and second heights H1 and H2 may be 100:1 or less. Accordingly, an excessive increase in the size of the entire semiconductor device 1 may be prevented.

A first sensing line SL1 may be disposed in the first semiconductor chip SC1. Specifically, the first sensing line SL1 may be disposed in the first semiconductor chip SC1, and a first bonding metal BM1, which exposes the first sensing line SL1 to the outside, may be disposed at the bottom surface of the first semiconductor chip SC1.

FIG. 2 illustrates that the first sensing line SL1, including a gate line GL, metal contacts MC1, MC3, and MC4, and wires M1 and M2, is electrically connected to the first bonding metal BM1, but the present disclosure is not limited thereto. That is, the structure of the first sensing line SL1 may vary.

A second sensing line SL2 may be disposed in the second semiconductor chip SC2. Specifically, the second sensing line SL2 may be disposed in the second semiconductor chip SC2, and a second bonding metal BM2, which exposes the second sensing line SL2 to the outside, may be disposed at the top surface of the second semiconductor chip SC2.

FIG. 2 illustrates that the second sensing line SL2, including a gate line GL, metal contacts MC2, MC3, and MC4, and wires M1 and M2, is electrically connected to the second bonding metal BM2, but the present disclosure is not limited thereto. That is, the structure of the second sensing line SL2 may vary.

In some embodiments, a height H3 of the first sensing line SL1 may differ from a height H4 of the second sensing line SL2. Specifically, the height H3 may be greater than the height H4.

Also, the height of the metal contact MC1 of the first sensing line SL1 may differ from the height of the metal contact MC2 of the second sensing line SL2. Specifically, the height of the metal contact MC1 of the first sensing line SL1 may be greater than the height of the metal contact MC2 of the second sensing line SL2.

The first sensing line SL1 may be disposed to extend along edge portions of the first semiconductor chip SC1, and the second sensing line SL2 may be disposed to extend along edge portions of the second semiconductor chip SC2. Specifically, the first sensing line SL1 may extend along the edge portions of the first semiconductor chip SC1 to surround the first semiconductor chip SC1, and the second sensing line SL2 may extend along the edge portions of the second semiconductor chip SC2 to surround the second semiconductor chip SC2. Accordingly, the first sensing line SL1 may extend to surround the memory cell array MCA, which is disposed in the first semiconductor chip SC1, and the second sensing line SL2 may extend to surround the peripheral circuit PC, which is disposed in the second semiconductor chip SC2.

The first and second sensing lines SL1 and SL2 may extend along the edge portions of the first and second semiconductor chips SC1 and SC2, respectively, because error or defects are more likely to occur in the edge portions than in the middle portions of the first and second semiconductor chips SC1 and SC2.

In some embodiments, as illustrated in FIGS. 2 and 3, the first and second bonding metals BM1 and BM2 may be disposed only in a particular area (for example, in a contact area CA), rather than extending along the first and second sensing lines SL1 and SL2. That is, the first and second sensing lines SL1 and SL2 may be electrically connected to each other via the first and second bonding metals BM1 and BM2, which are disposed in the particular area (for example, in the contact area CA). By providing the first and second bonding metals BM1 and BM2 only in the particular area (for example, in the contact area CA), parasitic capacitance that may occur between wires adjacent to the first and second sensing lines SL1 and SL2 can be reduced.

However, the present disclosure is not limited to this. Alternatively, the first and second bonding metals BM1 and BM2 may be configured to extend along the first and second sensing lines SL1 and SL2.

A detecting circuit DC1 may be disposed in the second semiconductor chip SC2. I/O pads IOP, which receive data from, or provide data to, the outside of the semiconductor device 1, may be disposed near the detecting circuit DC1, but the present disclosure is not limited thereto.

The detecting circuit DC1 may be disposed only in the second semiconductor chip SC2, but not in the first semiconductor chip SC1. The second sensing line SL2 may be electrically connected to the detecting circuit DC1. Since the first sensing line SL1 is electrically connected to the second sensing line SL2 via the first and second bonding metals BM1 and BM2, the first sensing line SL1 may also be electrically connected to the detecting circuit DC1.

The detecting circuit DC1 may detect defects from the first and second sensing lines SL1 and SL2. Examples of such defects may include cracks that may be generated in the first and second semiconductor chips SC1 and SC2 during the fabrication of the first and second semiconductor chips SC1 and SC2 (for example, during cutting or testing), but the present disclosure is not limited thereto.

The detecting circuit DC1 may detect defects from the first and second sensing lines SL1 and SL2 in various manners. In some embodiments, the detecting circuit DC1 may detect defects from the first and second sensing lines SL1 and SL2 by detecting resistance variations from the first and second sensing lines SL1 and SL2. The structure and an operation of the detecting circuit DC1 will hereinafter be described with reference to FIGS. 7 and 8, but the present disclosure is not limited thereto.

Figure 8:
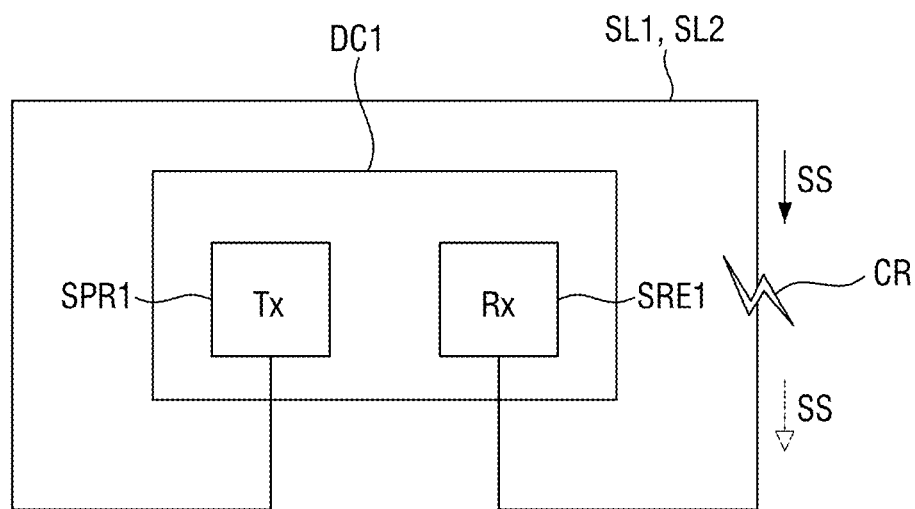
FIG. 8 is a block diagram illustrating a defect sensing operation of the semiconductor device of FIG. 1.

FIG. 7 is an example block diagram of the detecting circuit of FIG. 1. FIG. 8 is a block diagram illustrating a defect sensing operation of the semiconductor device of FIG. 1.

Referring to FIG. 7, the detecting circuit DC1 may include a signal provider SPR1 and a signal receiver SRE1. The signal provider SPR1 may generate a sensing signal SS and may output the sensing signal SS to the first and second sensing lines SL1 and SL2, and the signal receiver SRE1 may receive the sensing signal SS from the first and second sensing lines SL1 and SL2.

If there are no defects in the first and second sensing lines SL1 and SL2, the sensing signal SS output from the signal provider SPR1 may be received by the signal receiver SRE1 via the first and second sensing lines SL1 and SL2.

However, referring to FIG. 8, if there are defects in the first and second sensing lines SL1 and SL2, for example, if there are cracks CR, the sensing signal output from the signal provider SPR1 can no longer be delivered beyond the cracks CR so that the signal receiver SRE1 cannot receive the sensing signal SS. Accordingly, the detecting circuit DC1 may identify that there are defects in at least one of the first and second sensing lines SL1 and SL2.

The semiconductor device 1 may detect defects from the first and second semiconductor chips SC1 and SC2 using the first and second sensing lines SL1 and SL2 and the detecting circuit DC1. Since the detecting circuit DC1 is not disposed in the first semiconductor chip SC1, an excessive increase in the thickness of the first semiconductor chip SC1 can be prevented, and the fabrication of the first semiconductor chip SC1 can be simplified. Also, the integration density of the memory cell array MCA, which is disposed in the first semiconductor chip SC1, can be improved.

A semiconductor device according to some embodiments of the present disclosure will hereinafter be described with reference to FIGS. 9 to 13, focusing mainly on the differences with the semiconductor device 1 of FIGS. 1 to 8. FIGS. 9 to 13 mainly illustrate parts or elements that are distinctive of a semiconductor device according to some embodiments of the present disclosure.

Figure 9:
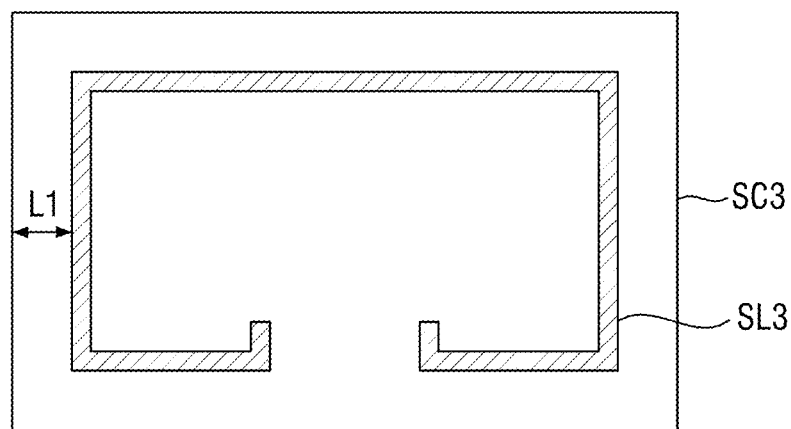
FIG. 9 illustrates individual layout views of semiconductor chips of a semiconductor device according to some embodiments of the present disclosure.
Figure 9:
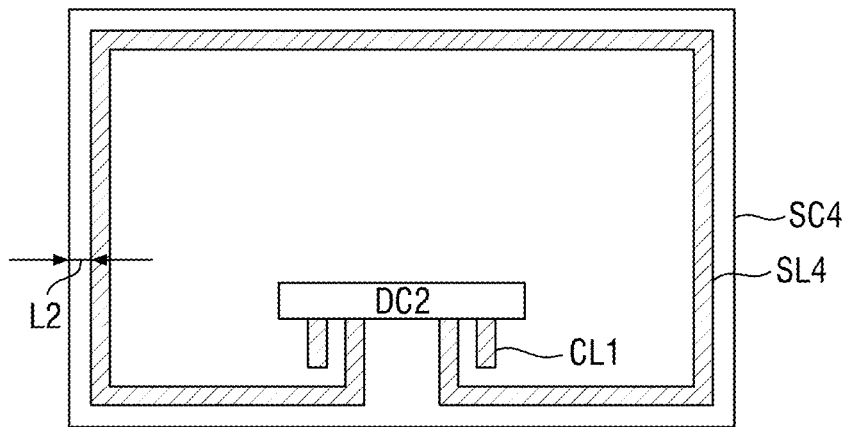
Figure 9:
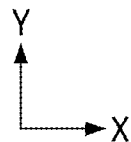
Figure 10:
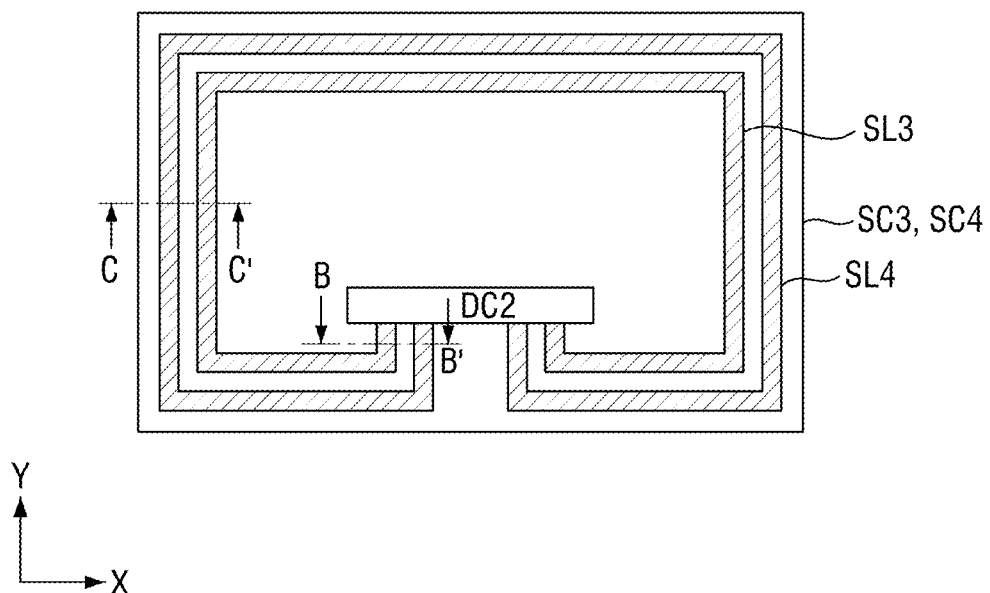
FIG. 10 is an integrated layout view of the semiconductor device of FIG. 9.

FIG. 9 illustrates individual layout views of semiconductor chips of a semiconductor device 2 according to some embodiments of the present disclosure. FIG. 10 is an integrated layout view of the semiconductor device 2 of FIG. 9.

Referring to FIGS. 9 and 10, a third sensing line SL3 may be disposed to surround a third semiconductor chip SC3, a fourth sensing line SL4 may be disposed to surround a fourth semiconductor chip SC4, and the third and fourth sensing lines SL3 and SL4 may be disposed not to vertically overlap with each other.

Specifically, the third sensing line SL3 may be disposed in the third semiconductor chip SC3 to be a first distance L1 apart from edge portions of the third semiconductor chip SC3, and the fourth sensing line SL4 may be disposed in the fourth semiconductor chip SC4 to be a second distance L2 apart from edge portions of the fourth semiconductor chip SC4. Since the first and second distances L1 and L2 are different, the third and fourth sensing lines SL3 and SL4 may not vertically overlap with each other even when the third and fourth semiconductor chips SC3 and SC4 are coupled together.

In some embodiments, the first distance L1 may be greater than the second distance L2. Accordingly, the third sensing line SL3 may be disposed on the inside of the fourth sensing line SL4.

A connecting line CL1 may be disposed in the fourth semiconductor chip SC4. The connecting line CL1 may electrically connect the third sensing line SL3 and a detecting circuit DC2. The third and fourth sensing lines SL3 and SL4 may not be electrically connected, and this will hereinafter be described with reference to FIGS. 11 and 12.

Figure 11:
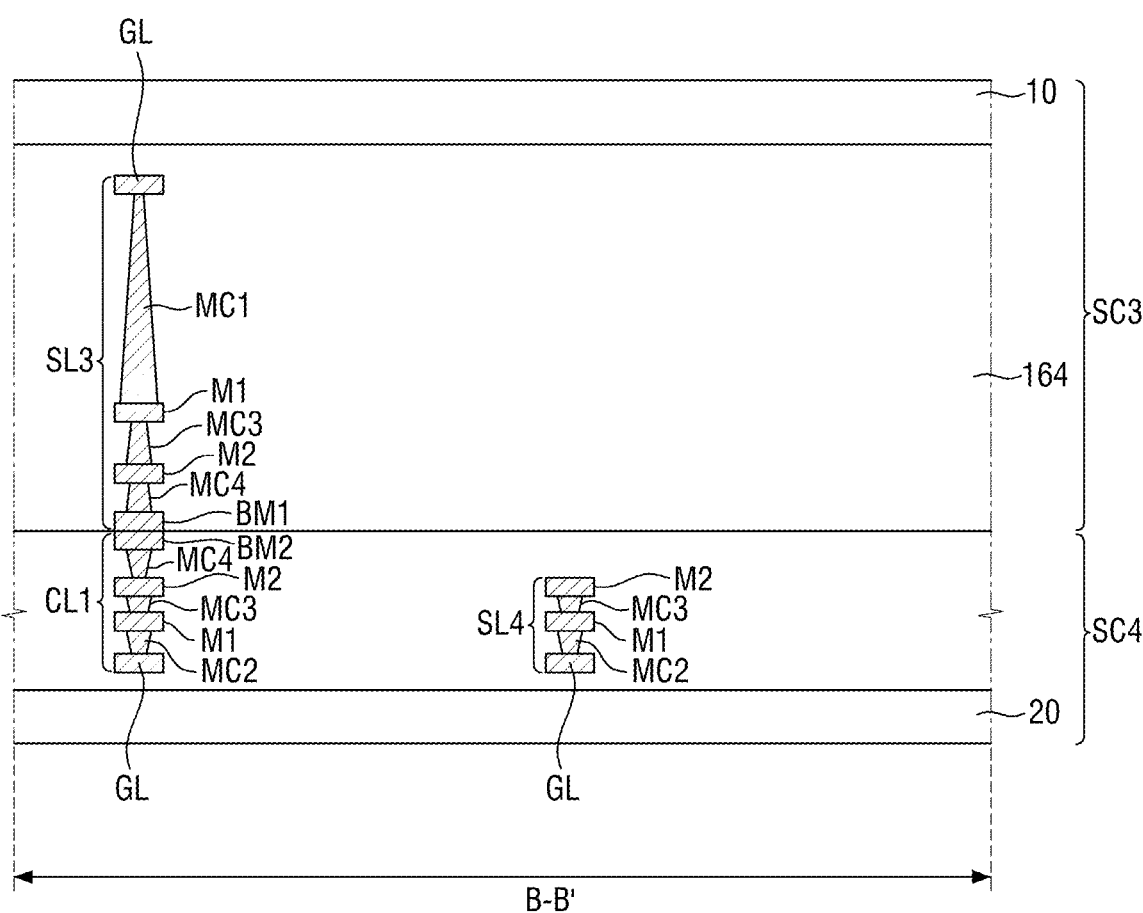
FIG. 11 is a cross-sectional view taken along line B-B' of FIG. 10.
Figure 12:
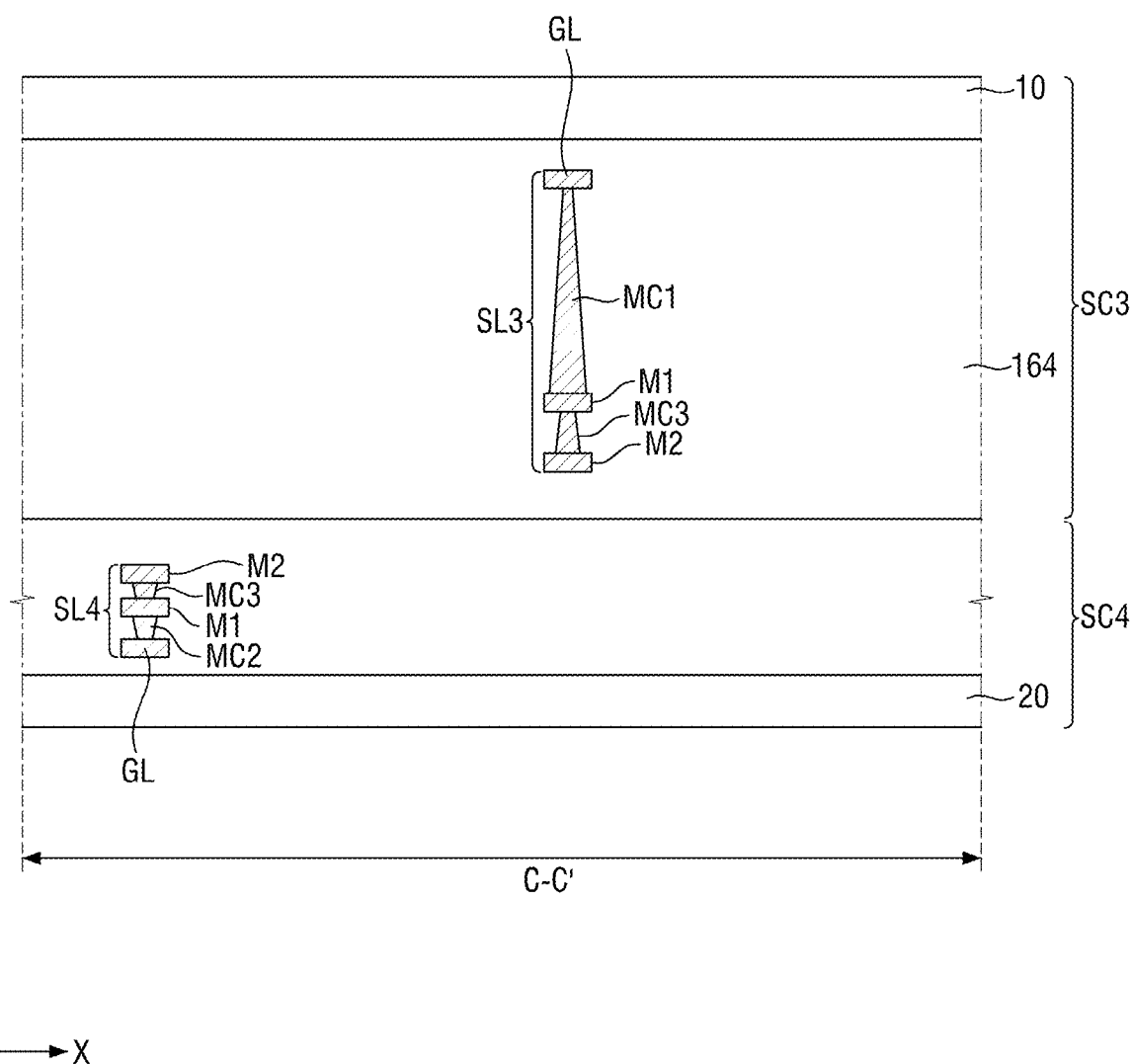
FIG. 12 is a cross-sectional view taken along line C-C' of FIG. 10.

FIG. 11 is a cross-sectional view taken along line B-B' of FIG. 10. FIG. 12 is a cross-sectional view taken along line C-C' of FIG. 10.

Referring to FIGS. 11 and 12, in some embodiments, a connecting line CL1 may include a gate line GL, metal contacts MC2, MC3, and MC4 and wires M1 and M2 and may be electrically connected to a third sensing line SL3 via a second bonding metal BM2, but the present disclosure is not limited thereto. That is, the structures of the connecting line CL1 and the third sensing line SL3 may vary.

A fourth sensing line SL4, unlike the second sensing line SL2 of FIG. 2, does not include a second bonding metal BM2 and a metal contact MC4. The third sensing line SL3, unlike the first sensing line SL1 of FIG. 2, does not include a first bonding metal BM1 and a metal contact MC4. Accordingly, even if the third and fourth sensing lines SL3 and SL4 vertically overlap with each other in the process of coupling third and fourth semiconductor chips SC3 and SC4, the third and fourth sensing lines SL3 and SL4 may not be electrically connected to each other.

Referring again to FIGS. 9 and 10, the detecting circuit DC2 may be disposed in the fourth semiconductor chip SC4. The detecting circuit DC2 may not be disposed in the third semiconductor chip SC3. As already mentioned above, the memory cell array MCA of FIG. 1 may be disposed in the third semiconductor chip SC3, and the peripheral circuit PC of FIG. 1 may be disposed in the fourth semiconductor chip SC4.

The fourth sensing line SL4 may be electrically connected to the detecting circuit DC2. The third sensing line SL3 may be electrically connected to the detecting circuit DC2 via the connecting line C11.

The detecting circuit DC2 may detect defects from the third and fourth sensing lines SL3 and SL4 in various manners. The structure of the detecting circuit DC2 will hereinafter be described with reference to FIG. 13, but the present disclosure is not limited thereto.

Figure 13:
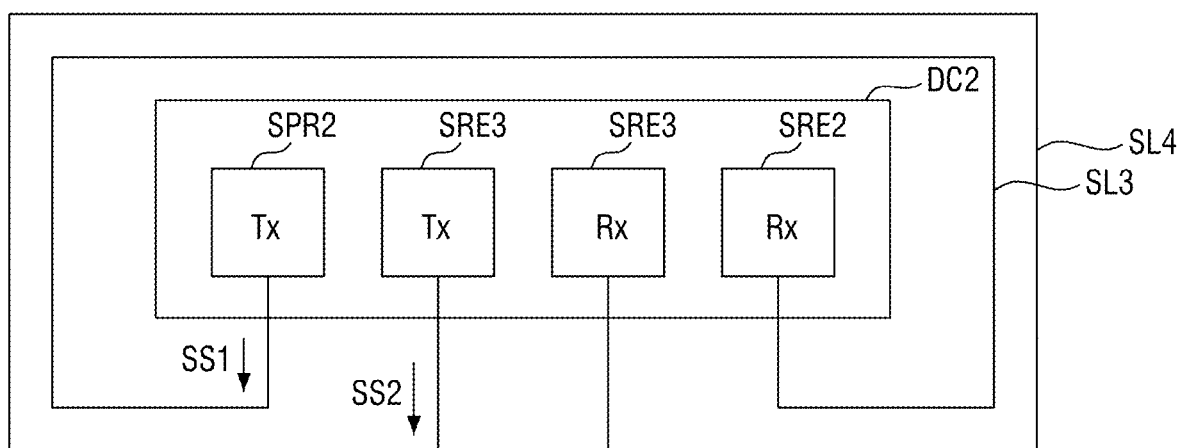
FIG. 13 is an example block diagram of a detecting circuit of FIG. 10.

FIG. 13 is an example block diagram of the detecting circuit of FIG. 10.

Referring to FIG. 13, the detecting circuit DC2 may include signal providers SPR2 and SPR3 and signal receivers SRE2 and SRE3.

The signal provider SPR2 may generate a first sensing signal SS1 and may output the first sensing signal SS1 to the third sensing line SL3, and the signal receiver SRE2 may receive the first sensing signal SS1 from the third sensing line SL3. The signal provider SPR3 may generate a second sensing signal SS2 and may output the second sensing signal SS2 to the fourth sensing line SL4, and the signal receiver SRE3 may receive the second sensing signal SS2 from the fourth sensing line SL4.

The detecting circuit DC2 may determine whether the third sensing line SL3 is defective based on whether the first sensing signal SS1 is received and may determine whether the fourth sensing line SL4 is defective based on whether the second sensing signal SS2 is received. That is, the detecting circuit DC2 can independently determine the presence of defects in the third and fourth semiconductor chips SC3 and SC4.

Figure 14:
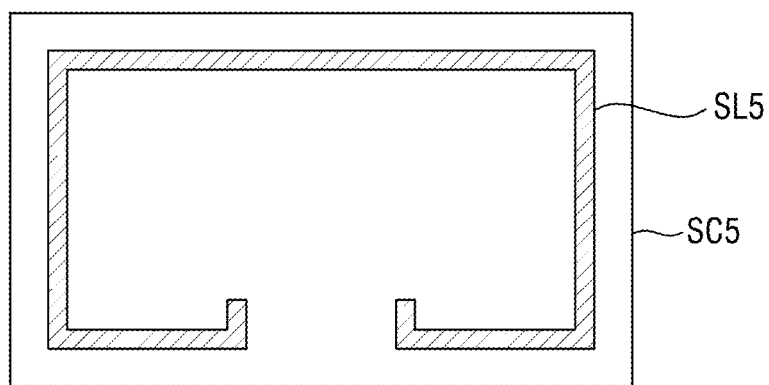
FIG. 14 illustrates individual layout views of semiconductor chips of a semiconductor device according to some embodiments of the present disclosure.
Figure 14:
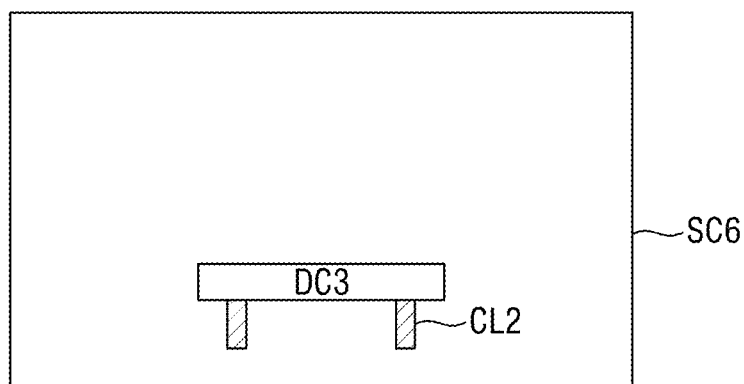

FIG. 14 illustrates individual layout views of semiconductor chips of a semiconductor device according to some embodiments of the present disclosure.

A semiconductor device 3 according to some embodiments of the present disclosure will hereinafter be described with reference to FIG. 14, focusing mainly on the differences with the semiconductor device 1 of FIGS. 1 to 8 and with the semiconductor device 2 of FIGS. 9 to 13.

Referring to FIG. 14, a fifth sensing line SL5 may be disposed to surround a fifth semiconductor chip SC5, and no sensing line may be disposed in a sixth semiconductor chip SC6, which is disposed below the fifth semiconductor chip SC5.

A detecting circuit DC3 may be disposed in the sixth semiconductor chip SC6. The detecting circuit DC3 may not be disposed in the fifth semiconductor chip SC5. As already mentioned above, the memory cell array MCA of FIG. 1 may be disposed in the fifth semiconductor chip SC5, and the peripheral circuit PC of FIG. 1 may be disposed in the sixth semiconductor chip SC6.

A connecting line CL2 may be disposed in the sixth semiconductor chip SC6. The connecting line CL2 may electrically connect the fifth sensing line SL5 and the detecting circuit DC3.

Figure 15:
FIG. 15 illustrates individual layout views of semiconductor chips of a semiconductor device according to some embodiments of the present disclosure.
Figure 15:
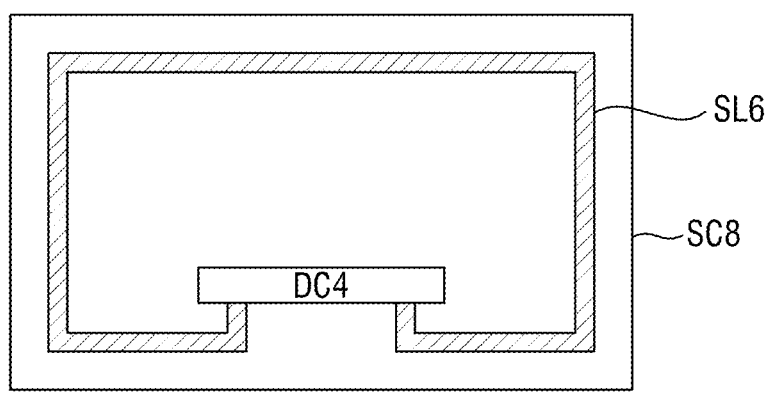

FIG. 15 illustrates individual layout views of semiconductor chips of a semiconductor device according to some embodiments of the present disclosure.

A semiconductor device 4 according to some embodiments of the present disclosure will hereinafter be described with reference to FIG. 15, focusing mainly on the differences with the semiconductor device 1 of FIGS. 1 to 8, with the semiconductor device 2 of FIGS. 9 to 13, and with the semiconductor device 3 of FIG. 14.

Referring to FIG. 15, a sixth sensing line SL6 may be disposed to surround an eighth semiconductor chip SC8 of the semiconductor device 4, and no sensing line may be disposed in a seventh semiconductor chip SC7, which is disposed above the eighth semiconductor chip SC8.

A detecting circuit DC4 may be disposed in the eighth semiconductor chip SC8. The detecting circuit DC4 may not be disposed in the seventh semiconductor chip SC7. As already mentioned above, the memory cell array MCA of FIG. 1 may be disposed in the seventh semiconductor chip SC7, and the peripheral circuit PC of FIG. 1 may be disposed in the eighth semiconductor chip SC8. The sixth sensing line SL6 may be electrically connected to the detecting circuit DC4.

In concluding the detailed description, those skilled in the art will appreciate that many variations and modifications may be made to the presented embodiments without substantially departing from the principles and feature of inventive concepts in the present disclosure. Therefore, the presented embodiments are used in a descriptive sense only and not for purposes of limitation.

What is claimed is:

1. A semiconductor device comprising:
  a first semiconductor chip including bitlines, wordlines, first bonding pads, second bonding pads, and memory cells,
    the memory cells being electrically connected to the bitlines and the wordlines,
    the first bonding pads being electrically connected to the bitlines, and
    the second bonding pads being electrically connected to the wordlines;
  a second semiconductor chip including third bonding pads, fourth bonding pads, and an input/output circuit,
    the third bonding pads being electrically connected to the first bonding pads,
    the fourth bonding pads being electrically connected to the second bonding pads, and
    the input/output circuit being configured to write data to the memory cells via the third bonding pads and the fourth bonding pads;
  a sensing line extending along an edge portion of the first semiconductor chip, an edge portion of the second semiconductor chip, or the edge portion of the first semiconductor chip and the edge portion of the second semiconductor chip; and
  a detecting circuit in the second semiconductor chip, the detecting circuit being configured to detect defects from the first semiconductor chip, the second semiconductor chip, or both the first semiconductor chip and the second semiconductor chip using the sensing line.

2. The semiconductor device of claim 1, wherein
  the sensing line extends along the edge portion of the first semiconductor chip to surround the first semiconductor chip,
  the sensing line extends along the edge portion of the second semiconductor chip to surround the second semiconductor chip, or
  the sensing line extends along the edge portion of the first semiconductor chip to surround the first semiconductor chip and the sensing line extends along the edge portion of the second semiconductor chip to surround the second semiconductor chip.

3. The semiconductor device of claim 2, wherein
  the input/output circuit is not in the first semiconductor chip, and
  the memory cells are not in the second semiconductor chip.

4. The semiconductor device of claim 1, wherein
  the first bonding pads and the second bonding pads are on a first surface of the first semiconductor chip, and
  the third bonding pads and the fourth bonding pads are on a second surface of the second semiconductor chip that faces the first surface of the first semiconductor chip.

5. The semiconductor device of claim 4, wherein
  the first bonding pads directly contact the third bonding pads, and
  the second bonding pads directly contact the fourth bonding pads.

6. The semiconductor device of claim 1, wherein
  the sensing line includes a first sensing line and a second sensing line that are in the first semiconductor chip and the second semiconductor chip, respectively,
  the first sensing line and the second sensing line are electrically connected to each other,
  the input/output circuit is not in the first semiconductor chip, and
  the memory cells are not in the second semiconductor chip.

7. The semiconductor device of claim 6, wherein
  the first semiconductor chip includes a first bonding metal on a first surface of the first semiconductor chip,
  the first bonding metal is electrically connected to the first sensing line,
  the second semiconductor chip includes a second bonding metal on a second surface of the second semiconductor chip,
  the second bonding metal is electrically connected to the second sensing line, and
  the first bonding metal and the second bonding metal directly contact each other.

8. The semiconductor device of claim 1, wherein
the sensing line includes a first sensing line and a second sensing line that are in the first semiconductor chip and the second semiconductor chip, respectively, the first sensing line and the second sensing line are electrically connected to the detecting circuit, and
the first sensing line and the second sensing line are not electrically connected to each other.

9. The semiconductor device of claim 8, wherein
the second semiconductor chip includes a connecting line that is electrically connected to the detecting circuit and is not electrically connected to the second sensing line, and
the first sensing line is electrically connected to the connecting line.

10. The semiconductor device of claim 8, wherein a first distance between the first sensing line and the edge portion of the first semiconductor chip differs from a second distance between the second sensing line and the edge portion of the second semiconductor chip.

11. The semiconductor device of claim 10, wherein the first distance is greater than the second distance.

12. The semiconductor device of claim 1, wherein
the sensing line is in the first semiconductor chip, but the sensing line is not in the second semiconductor chip,
the second semiconductor chip includes a connecting line that is electrically connected to the detecting circuit, and
the sensing line is electrically connected to the connecting line.

13. The semiconductor device of claim 1, wherein
the sensing line is in the second semiconductor chip, but the sensing line is not in the first semiconductor chip, and
the sensing line is electrically connected to the detecting circuit.

14. A semiconductor device comprising:
a first semiconductor chip including a first sensing line along edge portions of the first semiconductor chip to surround the first semiconductor chip;
a second semiconductor chip including a second sensing line along edge portions of the second semiconductor chip to surround the second semiconductor chip; and
a detecting circuit configured to detect defects from the first semiconductor chip using the first sensing line and configured to detect defects from the second semiconductor chip using the second sensing line,
the detecting circuit being in the second semiconductor chip, but the detecting circuit not being in the first semiconductor chip.

15. The semiconductor device of claim 14, wherein
the first semiconductor chip includes a first bonding metal on a first surface of the first semiconductor chip, the first bonding metal being electrically connected to the first sensing line,
the second semiconductor chip includes a second bonding metal on a second surface of the second semiconductor chip that faces the first surface of the first semiconductor chip, the second bonding metal being electrically connected to the second sensing line, and
the first bonding metal and the second bonding metal directly contact each other.

16. The semiconductor device of claim 14, wherein
the first sensing line and the second sensing line are electrically connected to the detecting circuit, and
the first sensing line and the second sensing line are not electrically connected to each other.

17. The semiconductor device of claim 16, wherein the first sensing line and the second sensing line do not vertically overlap with each other.

18. A semiconductor device comprising:
a first semiconductor chip;
a second semiconductor chip that is below the first semiconductor chip;
a sensing line extending along an edge portion the first semiconductor chip, an edge portion of the second semiconductor chip, or both the edge portion of the first semiconductor chip and the edge portion of the second semiconductor chip; and
a detecting circuit electrically connected to the sensing line and in the second semiconductor chip,
the detecting circuit being configured to detect defects from the first semiconductor chip, the second semiconductor chip, or both the first semiconductor chip and the second semiconductor chip using the sensing line, and
a first height from a bottom surface of a first substrate of the first semiconductor chip to a top surface of the first semiconductor chip differs from a second height from a bottom surface of a second substrate of the second semiconductor chip to a top surface of the second semiconductor chip.

19. The semiconductor device of claim 18, wherein the first height is greater than the second height.

20. The semiconductor device of claim 19, wherein a ratio of the first height and the second height is 2:1 to 100:1.

* * * * *

UNITED STATES PATENT AND TRADEMARK OFFICE
CERTIFICATE OF CORRECTION

PATENT NO. : 11,195,587 B2  
APPLICATION NO. : 16/886053  
DATED : December 7, 2021  
INVENTOR(S) : Jae Ick Son et al.

Page 1 of 1

It is certified that error appears in the above-identified patent and that said Letters Patent is hereby corrected as shown below:

In the Claims

Column 13, Line 54 Claim 1 insert:
--1. A semiconductor device comprising:
    a first semiconductor chip including bitlines, wordlines, first bonding pads, second bonding pads, and memory cells,
        the memory cells being electrically connected to the bitlines and the wordlines,
        the first bonding pads being electrically connected to the bitlines, and
        the second bonding pads being electrically connected to the wordlines;
    a second semiconductor chip including third bonding pads, fourth bonding pads, and an input/output circuit,
        the third bonding pads being electrically connected to the first bonding pads,
        the fourth bonding pads being electrically connected to the second bonding pads, and
        the input/output circuit being configured to write data to the memory cells via the third bonding pads and the fourth bonding pads;
    a sensing line extending along an edge portion of the first semiconductor chip, an edge portion of the second semiconductor chip, or both the edge portion of the first semiconductor chip and the edge portion of the second semiconductor chip; and
    a detecting circuit in the second semiconductor chip, the detecting circuit being configured to detect defects from the first semiconductor chip, the second semiconductor chip, or both the first semiconductor chip and the second semiconductor chip using the sensing line.--

Signed and Sealed this  
Fifteenth Day of February, 2022

Drew Hirshfeld  
*Performing the Functions and Duties of the*  
*Under Secretary of Commerce for Intellectual Property and*  
*Director of the United States Patent and Trademark Office*